United States Patent
Brown et al.

(10) Patent No.: US 8,209,573 B2
(45) Date of Patent: Jun. 26, 2012

(54) SEQUENTIAL ELEMENT LOW POWER SCAN IMPLEMENTATION

(75) Inventors: Jeff S. Brown, Fort Collins, CO (US); Mark F. Turner, Longmont, CO (US); Jonathan Byrn, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 183 days.

(21) Appl. No.: 12/341,825

(22) Filed: Dec. 22, 2008

(65) Prior Publication Data
US 2010/0162058 A1 Jun. 24, 2010

(51) Int. Cl.
*G01R 31/28* (2006.01)
*H03K 3/289* (2006.01)
(52) U.S. Cl. ........................ 714/726; 327/202
(58) Field of Classification Search .............. 714/726, 714/727; 327/202
See application file for complete search history.

(56) References Cited

U.S. PATENT DOCUMENTS

| | | | | |
|---|---|---|---|---|
| 5,041,742 A * | 8/1991 | Carbonaro | ................ | 326/97 |
| 5,576,651 A * | 11/1996 | Phillips | ................ | 327/202 |
| 5,619,511 A * | 4/1997 | Sugisawa et al. | ................ | 714/726 |
| 6,271,700 B1 * | 8/2001 | Itaya | ................ | 327/202 |
| 6,389,566 B1 * | 5/2002 | Wagner et al. | ................ | 714/726 |
| 6,794,914 B2 * | 9/2004 | Sani et al. | ................ | 327/202 |
| 6,853,212 B2 * | 2/2005 | Chandar et al. | ................ | 326/16 |
| 7,743,297 B2 * | 6/2010 | Uchida | ................ | 714/726 |

* cited by examiner

*Primary Examiner* — James C Kerveros

(57) ABSTRACT

A sequential element having a master stage and a slave stage and a method of testing an IC having a scan chain and an IC. In one embodiment, the sequential element includes an input scan multiplexor configured to place the sequential element in a functional mode or a scan mode in response to a scan enable input and a scan out driver coupled to the slave stage and configured to provide a scan out signal when the sequential element is in the scan mode, the scan out driver coupled to an inverted scan enable input for a negative voltage supply.

22 Claims, 2 Drawing Sheets

SEQUENTIAL ELEMENT LOW POWER SCAN IMPLEMENTATION

TECHNICAL FIELD

The invention is directed, in general, to sequential elements used in scan chains and, more specifically, to a sequential element with reduced power consumption.

BACKGROUND

Scan chains are used to obtain access to internal nodes of an integrated circuit and simplifying testing of ICs by setting and observing the sequential elements (e.g., flip-flops) thereof. Scan chains include flip-flops that together operate as a shift register when a scan enable signal is asserted. A single input pin may be used to provide test data to the scan chain and a single output pin can be connected to the output of the scan chain to read the state of each flip-flop in the scan chain. Typically, the test data are test patterns that are shifted in via the scan chains using a functional clock signal. The results are then shifted out to output pins of the IC and compared to expected results to determine possible failures.

Scan chains are typically connected to functional logic of the IC. During functional mode, data toggling causes scan chain nets dedicated to tests to toggle and consume power. Additionally, since the scan chain nets are typically connected to functional nets outside of sequential elements, the scan chains can also hinder functional performance.

A typical solution to address the performance issue is to have a dedicated scan output port on a sequential element which will unload the functional output of the cell. To address the power issue, a NAND gate can be added to the scan data output path to gate the signal when not in scan mode. The addition of a NAND gate to gate off the scan output from the sequential element, however, increases the area overhead. The additional NAND gate can also increase leakage power at all times and increase dynamic power during scan shift operations.

SUMMARY

One aspect provides a sequential element having a master stage and a slave stage. In one embodiment, the sequential element includes: (1) an input scan multiplexor configured to place the sequential element in a functional mode or a scan mode in response to a scan enable input and (2) a scan out driver coupled to the slave stage and configured to provide a scan out signal when the sequential element is in the scan mode, the scan out driver coupled to an inverted scan enable input for a negative voltage supply.

In another aspect, a method of testing an integrated circuit having a scan chain is provided. In one embodiment, the method includes: (1) asserting a scan enable input coupled to sequential elements of the scan chain, (2) receiving a scan input at the scan chain and (3) providing a scan output at a scan out driver of a sequential element of the scan chain, the scan out driver coupled to an inverted scan enable input for a negative voltage supply. In a different embodiment, the scan out driver is coupled to a scan enable input for a positive voltage supply.

In yet another aspect, an IC is provided. In one embodiment, the IC includes: (1) functional circuitry and (2) at least one scan chain coupled to the functional circuitry. The scan chain has at least one sequential element having a master stage, a slave stage and a sequential element including: (2A) an input scan multiplexor configured to place the sequential element in a functional mode or a scan mode in response to a scan enable input and (2B) a scan out driver coupled to the slave stage and configured to provide a scan out signal when the sequential element is in the scan mode, the scan out driver coupled to an inverted scan enable input for a negative voltage supply.

Still a different aspect provides a library of standard logic elements including a standard logic element corresponding to a sequential element having a master stage and a slave stage, and including: (1) an input scan multiplexor configured to place the sequential element in a functional mode or a scan mode in response to a scan enable input and (2) a scan out driver coupled to the slave stage and configured to provide a scan out signal when the sequential element is in the scan mode, wherein the scan out driver is coupled to an inverted scan enable input for a negative voltage supply.

BRIEF DESCRIPTION

Reference is now made to the following descriptions taken in conjunction with the accompanying drawings, in which.

DETAILED DESCRIPTION

The disclosure provides using existing signals of a typical sequential element design (e.g., a flip-flop design) to power gate a final output buffer of a sequential element used for the dedicated scan out output (SO) of a scan chain. As such, a sequential element is disclosed that is designed to reduce functional power consumption by gating off scan chain nets. By using existing signals in typical sequential element designs, a power reducing sequential element is provided that requires no or essentially no additional area overhead. This is especially evident in storage element designs having a dedicated SO port. The existing signals employed may be, for example, a scan enable input or an inverted scan enable input.

Figure 1:
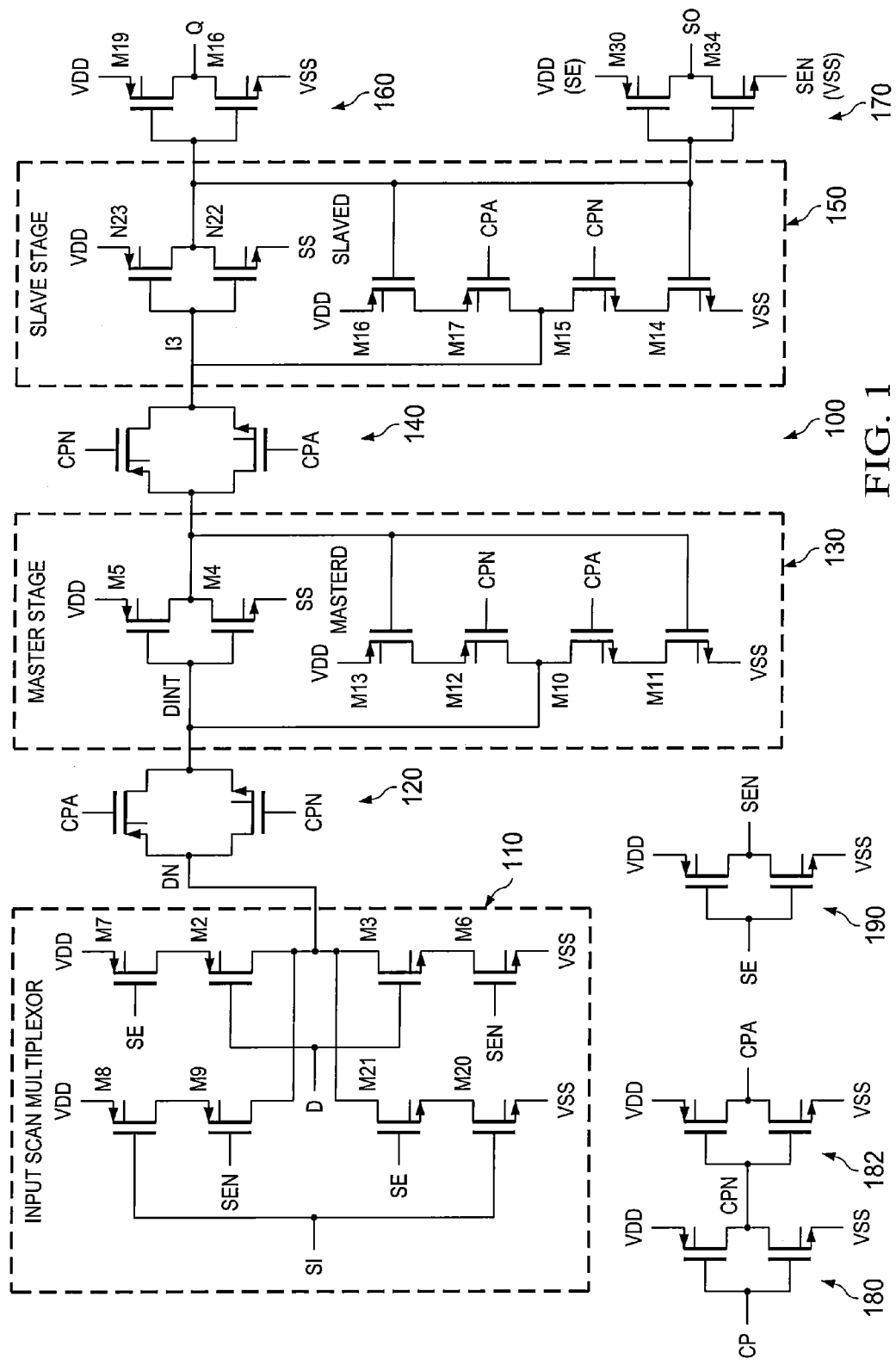
FIG. 1 is a schematic diagram of an embodiment of a scan flip-flop constructed according to the principles of the invention.

FIG. 1 is a schematic diagram of an embodiment of a scan flip-flop 100 constructed according to the principles of the present invention. The scan flip-flop 100 is a master-slave D flip-flop that can operate as a flip-flop or as a serial shift register to form a scan chain. Multiple of the flip-flops 100 may be used to form the scan chain. The scan flip-flop 100 includes an input scan multiplexor 110, a master stage passgate 120, a master stage 130, a slave stage passgate 140, a slave stage 150, a data output inverter 160 and a SO driver 170. Additionally, the scan flip-flop 100 has a functional data input D, a clock input CP, a scan enable input (SE), a functional data output Q and a dedicated scan out output SO. First and second series-coupled inverters 180, 182, are coupled to the clock input CP and respectively provide a negative clock pulse signal, CPN, and a positive clock pulse signal CPA. An SE buffer 190 receives the SE and provides an inverted scan enable input (referred to as scan enable not (SEN)) used for the input scan multiplexor 110 and the SO driver. The data output inverter 160 is coupled to the slave stage 150 and is configured to provide the functional data output Q to the functional logic of the IC.

In FIG. 1, references are made to a positive supply voltage and a negative supply voltage. Although the invention is not limited to a particular type of transistors, the various transistors of FIG. 1 are metal-oxide semiconductor field-effect transistors (MOSFETs), in which case the nominal positive supply voltage commonly referred to as Vdd, and the nominal negative supply voltage is commonly referred to as Vss.

The input scan multiplexor 110 is configured to allow operation of the scan flip-flop 100 in either a functional mode or a test mode (i.e., scan mode). The input scan multiplexor 110 includes a scan data input (SI), the functional data input D, a scan enable SE and an inverted scan enable SEN. When SE is asserted, the scan flip-flop 100 is in the scan mode and the input scan multiplexor 110 passes the SI to the master passgate 120. When SE is deasserted, the scan flip-flop 100 is in the functional mode and the input scan multiplexor 110 passes the D to the master stage passgate 120. The input scan multiplexor 110, therefore, can determine the mode of operation for the scan flip-flop 100 that results in an output of the flip-flop 100 being provided to functional logic of the IC or to a SI of the next flip-flop in the scan chain assuming all flip-flop scan enables are connected together.

The master stage passgate 120 is configured to pass the output of the input scan multiplexor 110 to the master stage 130 based on a clock signal. As FIG. 1 shows, CPA and CPN drive the master stage passgate 120, the master stage 130, the slave stage passgate 140 and the slave stage 150 to convey a logic state (either a "zero" or a "one") that is initially present at the master stage passgate 120 (from the SI or D data inputs) through the master stage 130, through the slave stage 150 and to the data output driver 160 as the functional data output or to the SO driver 170 as the SO. The scan flip-flop 100, therefore, includes two gated D latches connected in series, the master stage 130 and the slave stage 150, with the clock signal inverted to the slave stage 150. The slave stage 150 only changes in response to a change in the master stage 130.

The SO driver 170 is configured to provide a scan data output SO. Typically, the SO is provided to the input of another sequential element coupled to the scan flip-flop 100 to form part of a scan chain of the IC. The SO driver 170 is tapped off of an internal node (Node SLAVED) of the slave stage 150 to supply a dedicated SO that mimics the functional data output Q of the slave stage 150. The SO driver 170 is used in test mode to shift data in the scan chain from one sequential element's SO port to the next element's SI input port. In scan mode, SE is high which sets SEN low. Under these conditions the SO driver 170 is enabled and drives the SO. When SE is low, the scan flip-flop 100 is in functional mode, and the scan chain functionality and any toggling on those nets is wasting power. Under this mode, SEN is high, and the SO driver 170 is pinned high which prevents any toggling on the scan chain nets. Alternatively, SE may be coupled to the SO driver 170 along with VSS (represented by parenthesis in FIG. 1) instead of SEN and VDD.

Figure 2:
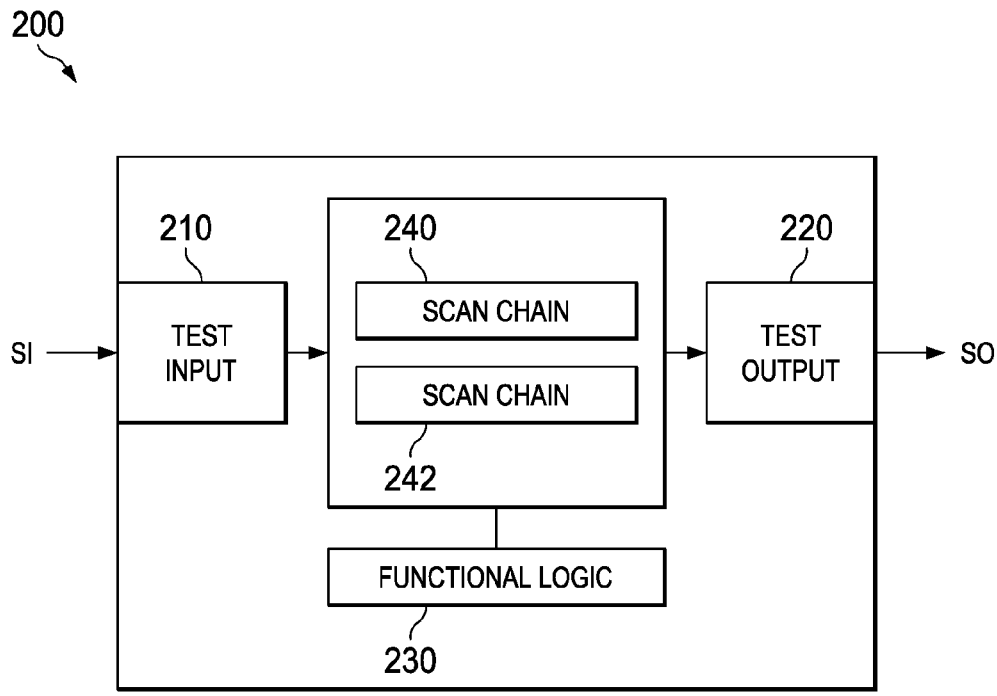
FIG. 2 is block diagram of an embodiment of an IC having a scan chain constructed according to the principles of the invention.

Turning now to FIG. 2, illustrated is an integrated circuit 200 including scan chains constructed according to the principles of the invention. The IC 200 includes a test input 210, a test output 220, functional logic 230 and scan chains 240 and 242. The IC 200 may also include additional components that are not illustrated or discussed but are typically included in an IC. For example, the IC 200 may include a clock, a TAP controller, a voltage interface, etc.

The test input 210 is an interface configured to receive a test pattern from, for example, automated test equipment (ATE). The test input 210 may be a TAP interface that is JTAG compliant and is controlled by a TAP controller (not illustrated). The test output 220 is configured to provide an external interface for a test output from the scan chains 240, 242. The test output may be provided to the ATE. The test output 220 may also be JTAG compliant. The functional logic 230 is the logic circuitry of the IC 200 that is configured to operate during the functional mode. The functional logic 230 may be coupled to at least one of the scan chains 240, 242.

The scan chains 240, 242, are configured to allow testing of the IC 200 during scan mode. Unlike conventional scan chains, the scan chains 240, 242, include at least one sequential element with an SO driver that employs the SEN as the negative voltage supply. Thus, the SO driver is coupled to the positive voltage supply Vdd and, instead of the negative voltage supply Vss, the SO driver is coupled to the SEN (i.e., a SEN SO driver). The scan chain may include multiple sequential elements having such an SO driver. In one embodiment, each sequential element of the scan chains 240, 242, may be the sequential elements with the SEN SO driver. The sequential element of the scan chains 240, 242, may be the scan flip-flop disclosed in FIG. 1. As with conventional scan chains, the scan chains 240, 242, are coupled in series to form a shift register when in scan mode. However, employing the SEN SO driver, the scan chains 240, 242, can provide the same capability for testing as conventional scan chains while consuming less power.

Figure 3:
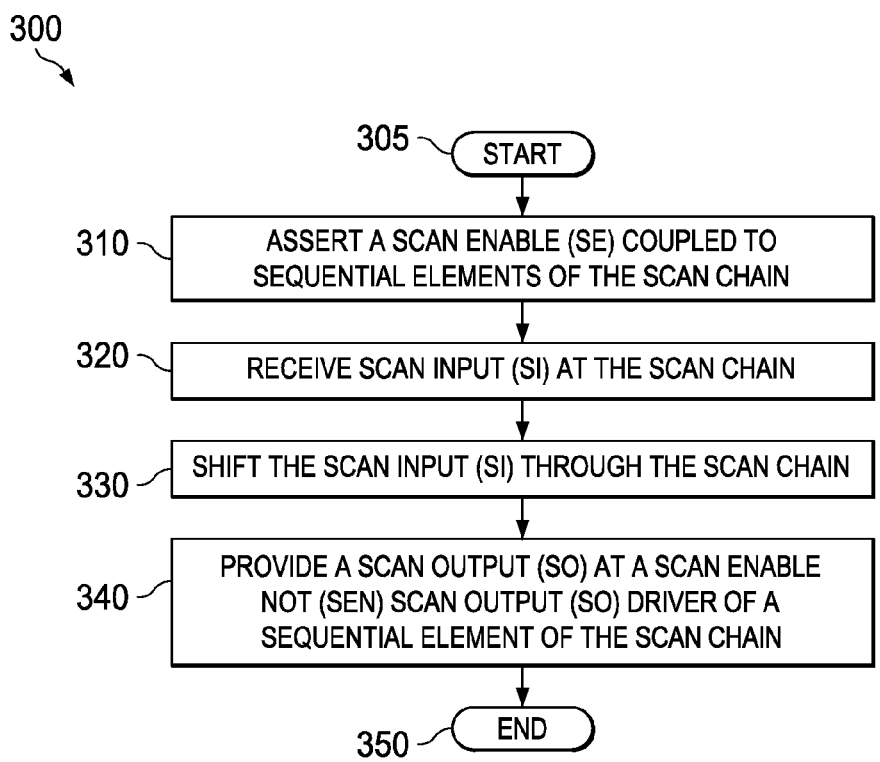
FIG. 3 is flow diagram of an embodiment of method of testing an IC having a scan chain carried out according to the principles of the invention.

FIG. 3 is a flow diagram of a method 300 of an embodiment of testing an IC having a scan chain carried out according to the principles of the present invention. The scan chain includes multiple sequential elements wherein at least some include a SEN SO driver as disclosed herein. The sequential elements, for example, may be the scan flip-flops of FIG. 1. The method begins in a step 305 with an intent to test the IC.

In a step 310, a SE coupled to sequential elements of the scan chain is asserted. The SE may be asserted by ATE coupled to the IC through a test input. In a step 320 a SI is received at the scan chain. The SI can be a test pattern that is also received from the ATE.

In a step 330, the SI is shifted through the scan chain. A clock signal is used to shift the SI through the scan chain. A SO is then provided at a SO driver of a sequential element of the scan chain in a step 340. The SO driver is a SEN SO driver that uses an inverted scan enable input (SEN) for a negative voltage supply. The SEN SO driver can provide the SO to the next serially coupled sequential element of the scan chain. Alternatively, the SO can be provided to a test output of the IC that provides an external interface to, for example, the ATE. After providing the SO at the SEN SO driver, the method ends in a step 350.

The disclosed sequential elements can be included in a library of cells allowing implementations of designs having a power reducing sequential element that requires no or essentially no additional area overhead. The library may include cells corresponding to a sequential element that includes a master stage, a slave stage, an input scan multiplexor and a scan out driver coupled to the slave stage. The input scan multiplexor is configured to place the sequential element in a functional mode or a scan mode in response to a scan enable input. The scan out driver is coupled to an inverted scan enable input for a negative voltage supply and is configured to provide a scan out signal when the sequential element is in the scan mode. In addition to being used as part of a standard cell library, the disclosed sequential element may be used as part of compiler generated designs or full-custom designs.

Those skilled in the art to which this application relates will appreciate that other and further additions, deletions, substitutions and modifications may be made to the described embodiments.

What is claimed is:

1. A sequential element having a master stage and a slave stage, comprising:
   an input scan multiplexor configured to place said sequential element in a functional mode or a scan mode in response to a scan enable input;
   a converter configured to receive said scan enable input and invert said scan enable signal to generate an inverted scan enable input; and
   a scan out driver coupled to said slave stage, said scan out driver having a negative voltage supply terminal coupled to said inverted scan enable input to receive a negative voltage supply and a positive voltage supply terminal coupled directly to a positive voltage supply, said scan out driver configured to generate a scan out signal when said sequential element is in said scan mode.

2. The sequential element as recited in claim 1 wherein said sequential element is a scan flip-flop and said inverted scan enable input is directly coupled to said negative voltage supply terminal.

3. The sequential element as recited in claim 1 wherein said scan out driver is coupled to an internal node of said slave stage.

4. The sequential element as recited in claim 1 further comprising a data output driver coupled to said scan out driver and configured to provide functional output data when said sequential element is in said functional mode.

5. The sequential element as recited in claim 1 further comprising a master stage passgate coupling said input scan multiplexor to said master stage and a slave stage passgate coupling said master stage to said slave stage.

6. The sequential element as recited in claim 1 wherein said inverted scan enable signal pins said scan out driver high when said sequential element is in functional mode.

7. The sequential element as recited in claim 1 wherein said sequential element is a CMOS component.

8. A method of testing an integrated circuit having a scan chain, comprising:
   asserting a scan enable input coupled to sequential elements of said scan chain;
   inverting said scan enable input to generate an inverted scan enable input;
   receiving a scan input at said scan chain;
   receiving said inverted scan enable input at a negative voltage supply terminal of a scan out driver of a sequential element of said scan chain and directly receiving a positive voltage supply at a positive voltage supply terminal of said scan out driver; and
   generating a scan output at said scan out driver when said scan enable input is asserted.

9. The method as recited in claim 8 wherein said sequential element is a scan flip-flop.

10. The method as recited in claim 8 wherein said scan out driver is coupled to an internal node of a slave stage of said sequential element.

11. The method as recited in claim 10 wherein said sequential element further includes a data output driver coupled to said scan out driver and configured to provide functional output data when said sequential element is in a functional mode.

12. The method as recited in claim 8 wherein said receiving is performed at an input scan multiplexor of one of said sequential elements.

13. The method as recited in claim 12 wherein each of said sequential elements includes a master stage and a slave stage.

14. The method as recited in claim 13 wherein each of said sequential elements includes a master passgate coupling said master stage to said input scan multiplexor and a slave passgate coupling said master stage to said slave stage.

15. An integrated circuit, comprising:
   functional circuitry; and
   at least one scan chain coupled to said functional circuitry, said scan chain having at least one sequential element having a master stage and a slave stage, said sequential element including:
      an input scan multiplexor configured to place said sequential element in a functional mode or a scan mode in response to a scan enable input;
      a converter configured to receive said scan enable input and invert said scan enable signal to generate an inverted scan enable input; and
      a scan out driver coupled to said slave stage, said scan out driver having a negative voltage supply terminal coupled to said inverted scan enable input to receive a negative voltage supply and a positive voltage supply terminal coupled directly to a positive voltage supply, said scan out driver configured to generate a scan out signal when said sequential element is in said scan mode.

16. The integrated circuit as recited in claim 15 wherein said sequential element is a scan flip-flop.

17. The integrated circuit as recited in claim 15 wherein said scan out driver is coupled to an internal node of said slave stage.

18. The integrated circuit as recited in claim 15 further comprising a data output driver coupled to said scan out driver and configured to provide functional output data when said sequential element is in said functional mode.

19. The integrated circuit as recited in claim 15 further comprising a master stage passgate coupling said input scan multiplexor to said master stage and a slave stage passgate coupling said master stage to said slave stage.

20. The integrated circuit as recited in claim 15 wherein said inverted scan enable signal pins said scan out driver high when said sequential element is in functional mode.

21. A library of logic elements for use with integrated circuits, comprising:
   a standard logic element corresponding to a sequential element having a master stage and a slave stage, and including:
      an input scan multiplexor configured to place said sequential element in a functional mode or a scan mode in response to a scan enable input;
      a converter configured to receive said scan enable input and invert said scan enable signal to generate an inverted scan enable input; and
      a scan out driver coupled to said slave stage, said scan out driver having a negative voltage supply terminal coupled to said inverted scan enable input to receive a negative voltage supply and a positive voltage supply terminal coupled directly to a positive voltage supply, said scan out driver configured to generate a scan out signal when said sequential element is in said scan mode.

22. A sequential element having a master stage and a slave stage, comprising:
   an input scan multiplexor configured to place said sequential element in a functional mode or a scan mode in response to a scan enable input; and
   a scan out driver coupled to said slave stage, said scan out driver having a positive voltage supply terminal coupled to said scan enable input to receive a positive voltage supply and a negative voltage supply terminal coupled directly to a negative voltage supply, said scan out driver configured to generate a scan out signal when said sequential element is in said scan mode.

* * * * *